(12) United States Patent
Kuo et al.

(10) Patent No.: US 7,088,165 B2
(45) Date of Patent: Aug. 8, 2006

(54) VOLTAGE LEVEL SHIFTER AND SEQUENTIAL PULSE GENERATOR

(75) Inventors: Chung-Hong Kuo, Tainan (TW); Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/854,813

(22) Filed: May 27, 2004

(65) Prior Publication Data

US 2005/0200397 A1 Sep. 15, 2005

(30) Foreign Application Priority Data

Mar. 10, 2004 (TW) .............................. 93106289 A (51) Int. Cl.
*H03L 5/00* (2006.01)
(52) U.S. Cl. ...................................... 327/333
(58) Field of Classification Search ................... 326/80, 326/81; 327/306, 318, 319, 333
See application file for complete search history.

(56) References Cited

U.S. PATENT DOCUMENTS

| 5,321,324 | A  | * | 6/1994  | Hardee et al. ................ 326/62 |
| 6,384,808 | B1 | * | 5/2002  | Azami ........................ 345/100 |
| 6,605,963 | B1 | * | 8/2003  | Kitamoto et al. ............. 326/81 |
| 6,731,273 | B1 | * | 5/2004  | Koyama et al. ............ 345/204 |
| 6,756,835 | B1 | * | 6/2004  | Yu ............................... 327/333 |
| 6,801,053 | B1 | * | 10/2004 | Sun .............................. 326/68 |
| 6,861,889 | B1 | * | 3/2005  | Tobita ........................ 327/333 |
| 6,972,594 | B1 | * | 12/2005 | Yu ................................ 326/68 |
| 2004/0183568 | A1 | * | 9/2004 | Yu .............................. 326/80 |

FOREIGN PATENT DOCUMENTS

CN       1551502 A       12/2004

* cited by examiner

*Primary Examiner*—Jeffrey Zweizig
(74) *Attorney, Agent, or Firm*—Thomas, Kayden, Horstmeyer & Risley (57) ABSTRACT

A voltage level shifter. The voltage level shifter comprises a shifter unit and a controller. The shifter unit outputs a third signal according to a first signal and a second signal. When the first signal remains at a first level a current path is formed in the shifter unit. The controller is coupled to the shifter unit and stops the current path when the first signal remains at the first level.

13 Claims, 6 Drawing Sheets

VOLTAGE LEVEL SHIFTER AND SEQUENTIAL PULSE GENERATOR

BACKGROUND OF THE INVENTION

1. Field of the Invention

The present invention relates to a voltage level shifter, and in particular to a voltage level shifter for a liquid crystal display to reduce power consumption when the level of an input signal is switched.

2. Description of the Related Art

Figure 1:
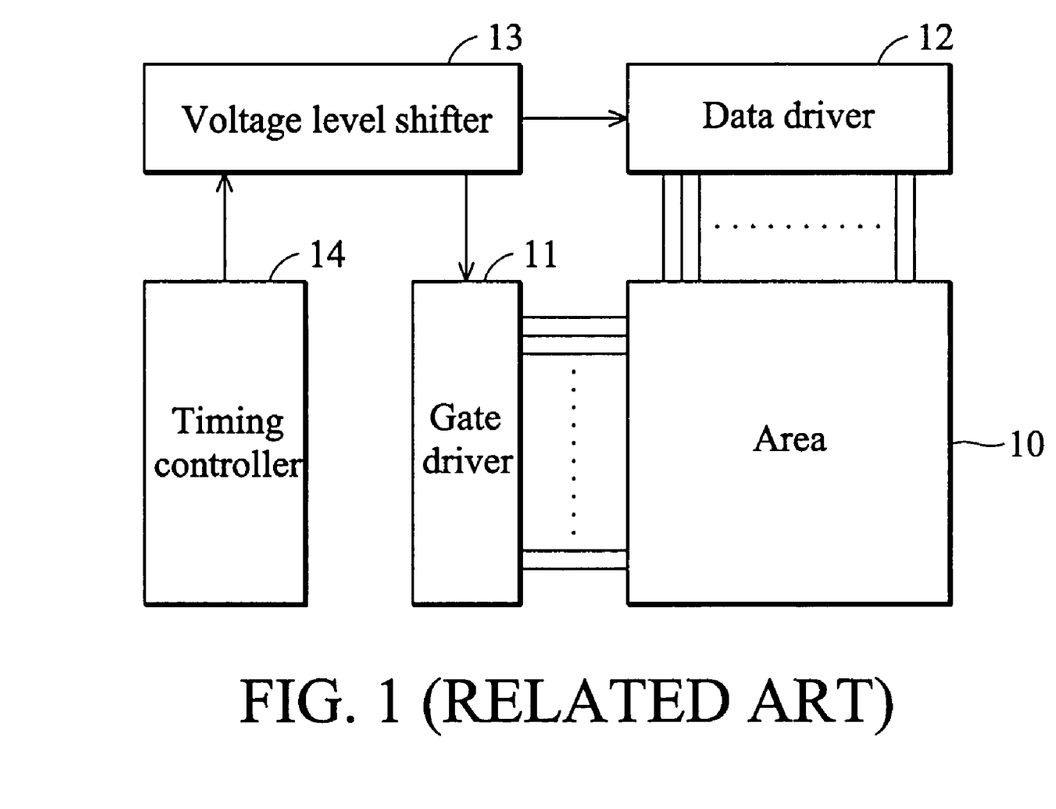
FIG. 1 shows a schematic diagram of a conventional liquid crystal display system.

FIG. 1 shows a schematic diagram of a conventional liquid crystal display system (hereinafter, referred to as an "LCD system"). The LCD system comprises a display area 10, a gate driver 11, a data driver 12, a voltage level shifter 13, and a timing controller 14. The voltage level shifter 13 receives low-level timing signals from the timing controller 14. In order to allow back-end components to correctly read the timing signals, the voltage level shifter 13 raises levels of the timing signals. Then, the raised timing signals are output from the voltage level shifter 13. According to the raised timing signals, the gate driver 11 and the scan driver 12 are driven to display images in the display area 10.

Figure 2:
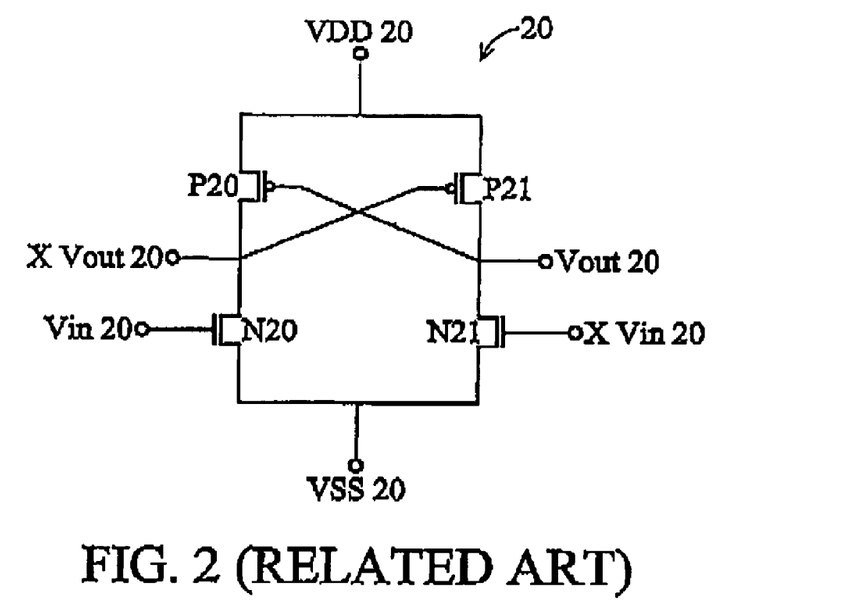
FIGS. 2 and 3 show a conventional voltage level shifter.
Figure 3:
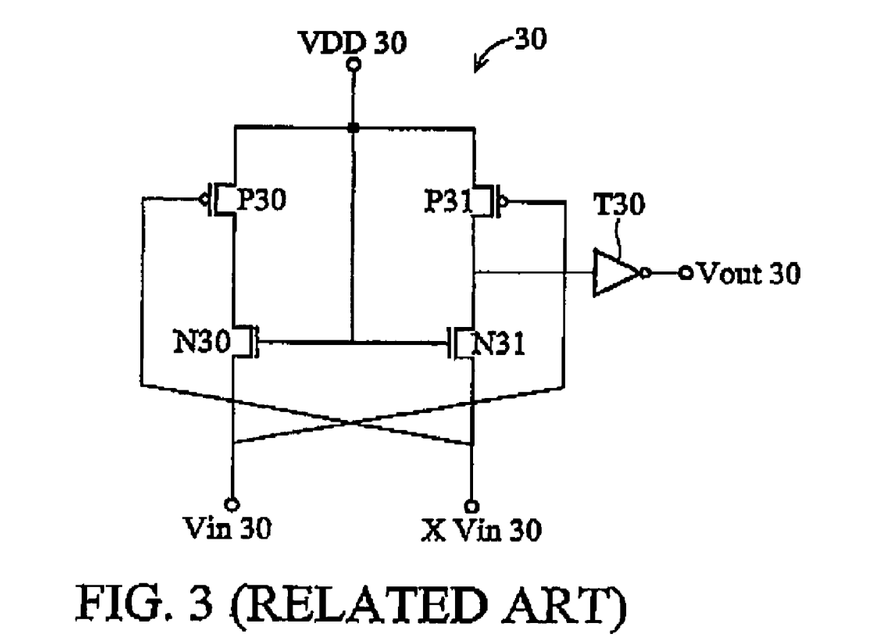

Generally, there are two circuit types for voltage level shifters as shown in FIG. 2 and FIG. 3. The major distinction is the location at which an input signal is input into each of the two circuit types for level shifters. Referring to the voltage level shifter 20 of FIG. 2, an input signal Vin20 is input to a gate of a NMOS transistor N20, and an input signal XVin20, inverse to the input signal Vin20, is input to a gate of a NMOS transistor N21. Since a operational time of the voltage level shifter 20 exceeds that of the voltage level shifter 30, the voltage level shifter 30 is always used to shift levels of signals.

Referring to the voltage level shifter 30 of FIG. 3, an input signal Vin30 is input to a source of a NMOS transistor N30, and an input signal XVin30, inverse to the input signal Vin30, is input to a source of a NMOS transistor N31. In the level shifter 3, sources of the PMOS transistors P30 and P31 are coupled to a voltage source VDD30 having a high voltage level. Since gates of the transistors N30 and N31 are both coupled to the voltage source VDD30, the transistors N30 and N31 remain turned on. When the input signal Vin30 remains at a low voltage level while input signal XVin30 remains at a high voltage level, a PMOS transistor P30 is turned off and a PMOS transistor P31 is turned on.

At this time, because a voltage level of the voltage source VDD30 is not equal to that of the input signal XVin30, a direct current path is formed between the sources of the PMOS transistor P31 and the NMOS transistor N31. The direct current path increases power consumption of the LCD system and reduces thin film transistors within the display area 10.

SUMMARY OF THE INVENTION

Accordingly, an object of the present invention is to provide a voltage level shifter for liquid crystal display to reduce power consumption when the voltage level shifter switches a level of an input signal.

According to the object described above, the present invention provides a voltage level shifter comprising a shifter unit and a controller. The shifter unit outputs a third signal according to a first signal and a second signal. When the first signal remains at a first level a current path is formed in the shifter unit. The controller is coupled to the shifter unit and stops the current path when the first signal remains at the first level.

According to the object described above, the present invention further provides a voltage level shifter. The voltage level shifter comprises a shifting unit and a control unit. The shifting unit has a first PMOS transistor, a first NMOS transistor, a second PMOS transistor, and a second NMOS transistor. The first NMOS transistor is coupled to the first transistor between a first voltage source and a first node. The second NMOS transistor is coupled to the second PMOS transistor between the first voltage and a second node. In addition, the first node and the second node are respectively coupled to a gate of the second PMOS transistor and a gate of the first PMOS transistor, and a gate of the first NMOS transistor and a gate of the NMOS second transistor are coupled to the first voltage source.

The control unit has a first switch, a second switch, and a third switch. The first switch has a first control terminal, a first input terminal coupled to a noninverting input terminal, and a first output terminal coupled to the first node. The second switch has a second control terminal, a second input terminal coupled to an inverting input terminal, and a second output terminal coupled to the second node. The third switch has a third control terminal, a third input terminal coupled to the first voltage source, and a third output coupled the first node and the second node. The first control terminal, the second control terminal, and the third control terminal receive an enable signal. When the enable signal is at a first level, the first switch and the second switch are turned on, and the third switch turned off. Then a first signal and a second signal, complementary to each other and inputted from the noninverting input terminal and the inverting terminal, are correspondingly transmitted to the first node and the second node to be transferred in voltage by the shifting unit.

When the enable signal is at a second level, the first switch and the second switch are turned off, and the third switch turned on. Then a voltage of the first voltage source is transmitted to the first node and the second node. Thus, after the first signal is switched form a third level to a fourth level, there is no direct current path between the first voltage source and the noninverting input terminal or between the first voltage source and the inverting input terminal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 4:
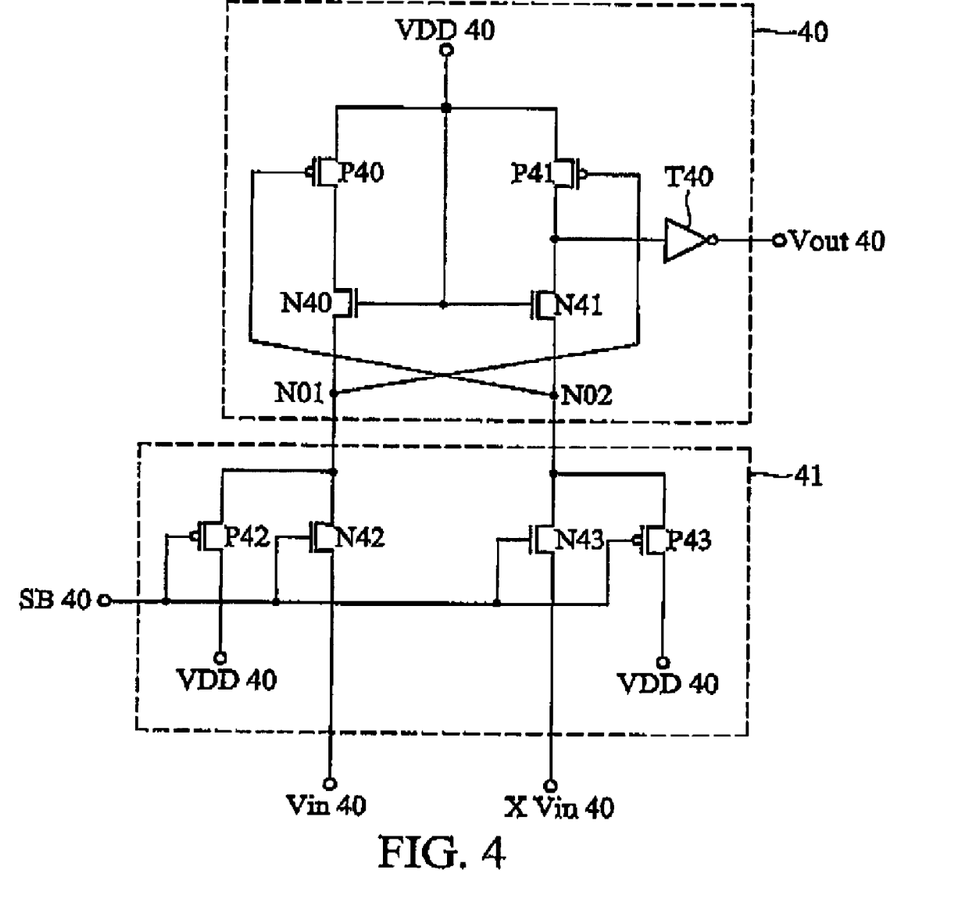
FIG. 4 shows one operating example of a voltage level shifter according to the present invention.

FIG. 4 shows one operating example of a voltage level shifter according to the present invention. The voltage level shifter comprises a level shifting unit 40 and a control unit 41. The level shifting unit 40 comprises NMOS transistors N40 and N41, PMOS transistors P40 and P41, and an inverter T40. A gate of the NMOS transistor N40 is coupled to a voltage source VDD40 having a high-level voltage, and a source of the NMOS transistor N40 is coupled to a node NO1. A gate of the NMOS transistor N41 is coupled to the voltage source VDD40, and a source of the NMOS transistor N41 is coupled to a node NO2. A gate of the PMOS transistor P40 is coupled to the node NO2, a source of the transistor P40 is coupled to the voltage source VDD40, and a drain of the transistor P40 is coupled to a drain of the NMOS transistor N40. A gate of the PMOS transistor P41 is coupled to the node NO1, a source of the transistor P41 is coupled to the voltage source VDD40, and a drain of the transistor P41 is coupled to a drain of the NMOS transistor N41. An input terminal of the inverter T40 is coupled to the drains of the NMOS transistor N41 and the PMOS transistor P41.

The control unit 41 has NMOS transistors N42 and N43, and PMOS transistor P42 and P43. A gate of the NMOS transistor N42 receives an enabling signal SB40, a drain of the NMOS transistor N42 is coupled to the node NO01, and a source of the NMOS transistor N42 receives an input signal Vin40. A gate of the NMOS transistor N43 receives the enabling signal SB40, a drain of the NMOS transistor N43 is coupled to the node NO2, and a source of the NMOS transistor N43 receives an input signal XVin40. A gate of the PMOS transistor P42 receives the enabling signal SB40, a source of the PMOS transistor P42 is coupled to the node NO01, and a drain of the PMOS transistor P42 is coupled to the voltage source VDD40. A gate of the PMOS transistor P43 receives the enabling signal SB40, a source of the PMOS transistor P43 is coupled to the node NO02, and a drain of the PMOS transistor P43 is coupled to the voltage source VDD40. In addition, the input signal Vin40 and the input signal XVin40 are opposite to each other.

When the input signal Vin4O remains at a high voltage level, a voltage level of the enabling signal SB4O is high. The PMOS transistors P42 and P43 are turned off, and the NMOS transistors N42 and N43 are turned on. At this time, the input signal Vin4O is input to the source of the NMOS transistor N40 when the input signal XVin40 is input to the source of the NMOS transistor N41. Moreover, the PMOS transistor P40 is turned on, and the PMOS transistor P41 turned off. Because gates of the NMOS transistors N40 and N41 are coupled to the voltage source VDD40, the NMOS transistors N40 and N41 remain turned on. According to the above operations of the transistors, a voltage level of the input terminal of the inverter T40 is low. Then, the inverter T40 outputs an output signal Vout40 whose voltage level is high. When that the input signal Vout40 remains at the high voltage level, the shifting unit 40 performs normal operation.

When the input signal Vin40 remains at a low voltage level, the voltage level of the enabling signal SB40 is low. The PMOS transistors P42 and P43 are turned on, and the NMOS transistors N42 and N43 are turned off. At this time, voltage levels of sources of the NMOS transistors N40 and N41 are same as those of the voltage source VDD40. That is, voltage levels of sources of the NMOS transistors N40 and N41 are high. The PMOS transistors P40 and P41 are turned off. According to the above operations of the transistors, the voltage level of the input terminal of the inverter T40 is high. Then, the inverter T40 outputs the output signal Vout40 whose voltage level is low. When the input signal Vin40 remains at the low voltage level, the NMOS transistor N41 remains turned on; however, the PMOS transistor P40 is turned off to cut off the direct current path, for decreasing power consumption according to the control of the enable signal VS40. In addition, since a signal of the input terminal of the inverter T40 is high voltage level, the output signal Vout40 having low voltage level is output from the output terminal of the inverter T40. The voltage level of the output signal Vout40 is adjusted by the inverter T40 to carry out the operation of the voltage level shifter.

Figure 5:
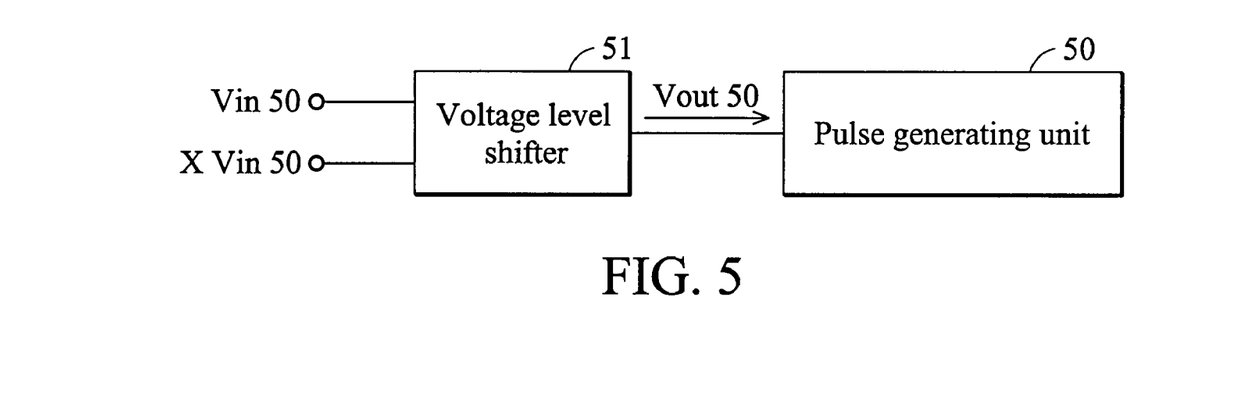
FIG. 5 is a block diagram of a voltage level shifter and a pulse generator within a gate driver in the conventional liquid crystal display system.
Figure 6:
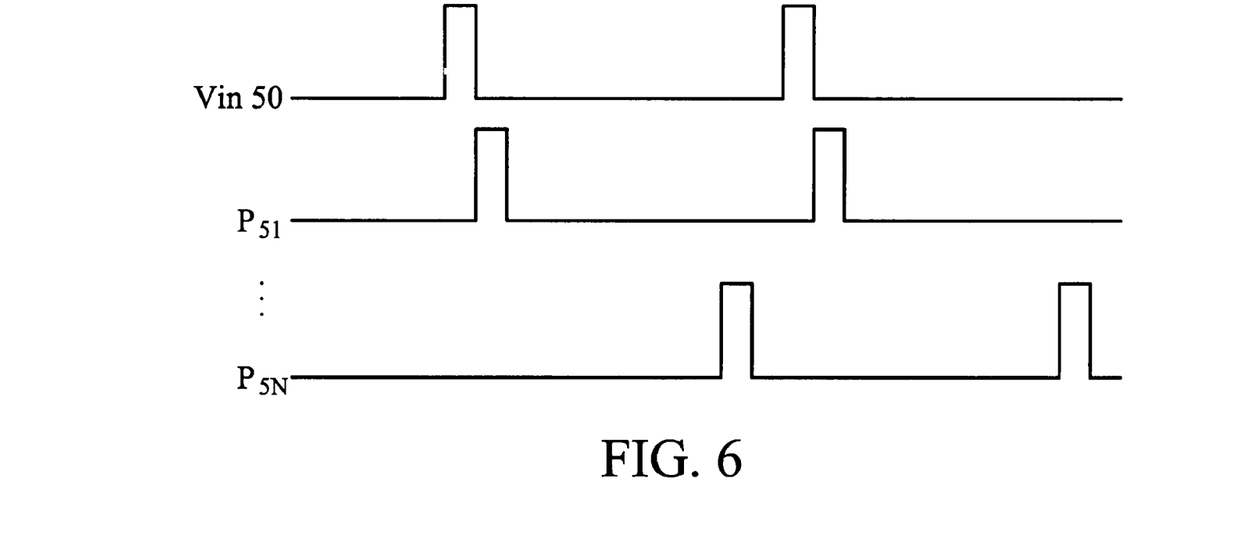
FIG. 6 is a timing chart of pulse signals generated by the pulse generator of FIG. 5.

In the embodiment of the present invention, the enabling signal can be generated according to a pulse generating unit. Referring to FIG. 5, a conventional gate driver comprises the pulse generating unit 50. The pulse generating unit 50 generates a plurality of pulses, when a voltage level shifter 51 outputs a driving signal to the pulse generating unit 50 according to an input signal Vin50. FIG. 6 is a timing chart for generating pulses by the pulse generating unit 50. When a voltage level of the input signal Vin50 is high, the pulse generating unit 50 starts to sequentially generate N pulses $P_51$ to $P_5N$. When pulses $P_51$ to $P_5N$ are generated, the voltage level of the input signal is changed from high to low. The voltage level of the input signal Vin50 remains low and is changed to high until the pulse $P_5N$ is generated. Then the pulse generating unit 50 generates N pulses again.

Figure 7:
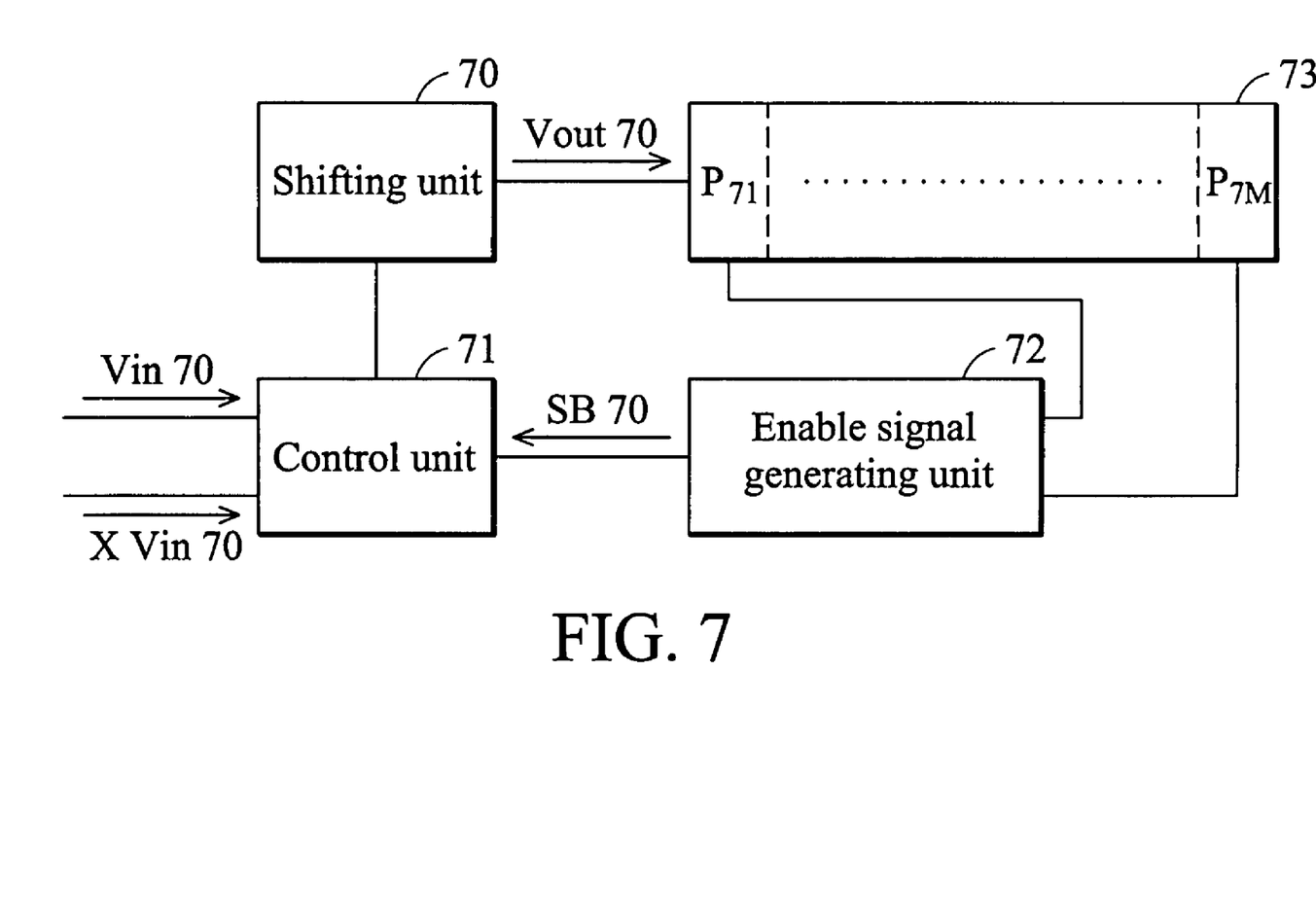
FIG. 7 shows an other operating example of the voltage level shifter according to the present invention.

FIG. 7 shows an other operating example of the voltage level shifter according to the present invention. The voltage level shifter comprises an enable signal generating unit 72 and a pulse generating unit 73 in addition to a shifting unit 70 and a control unit 71. Circuit structures of the shifting unit 70 and the control unit 71 are shown in FIG. 4. The enable signal generating unit 72 receives the 1st pulse and the M-th pulse from the pulse generating unit 73. After an input signal Vin70, whose voltage level is high, is transformed to a output signal Vout70, for driving the pulse generating unit 73 to generate the first pulse, the voltage of the input signal Vin70 becomes low. The voltage level of the input signal Vin70 remains low and is changed to high when the M-th pulse is generated. Therefore, according to the 1st pulse and the M-th pulse, the enable signal generating unit 72 can detect the voltage level of the input signal Vin70 and determines a voltage level of the enabling signal VB70.

Figure 8:
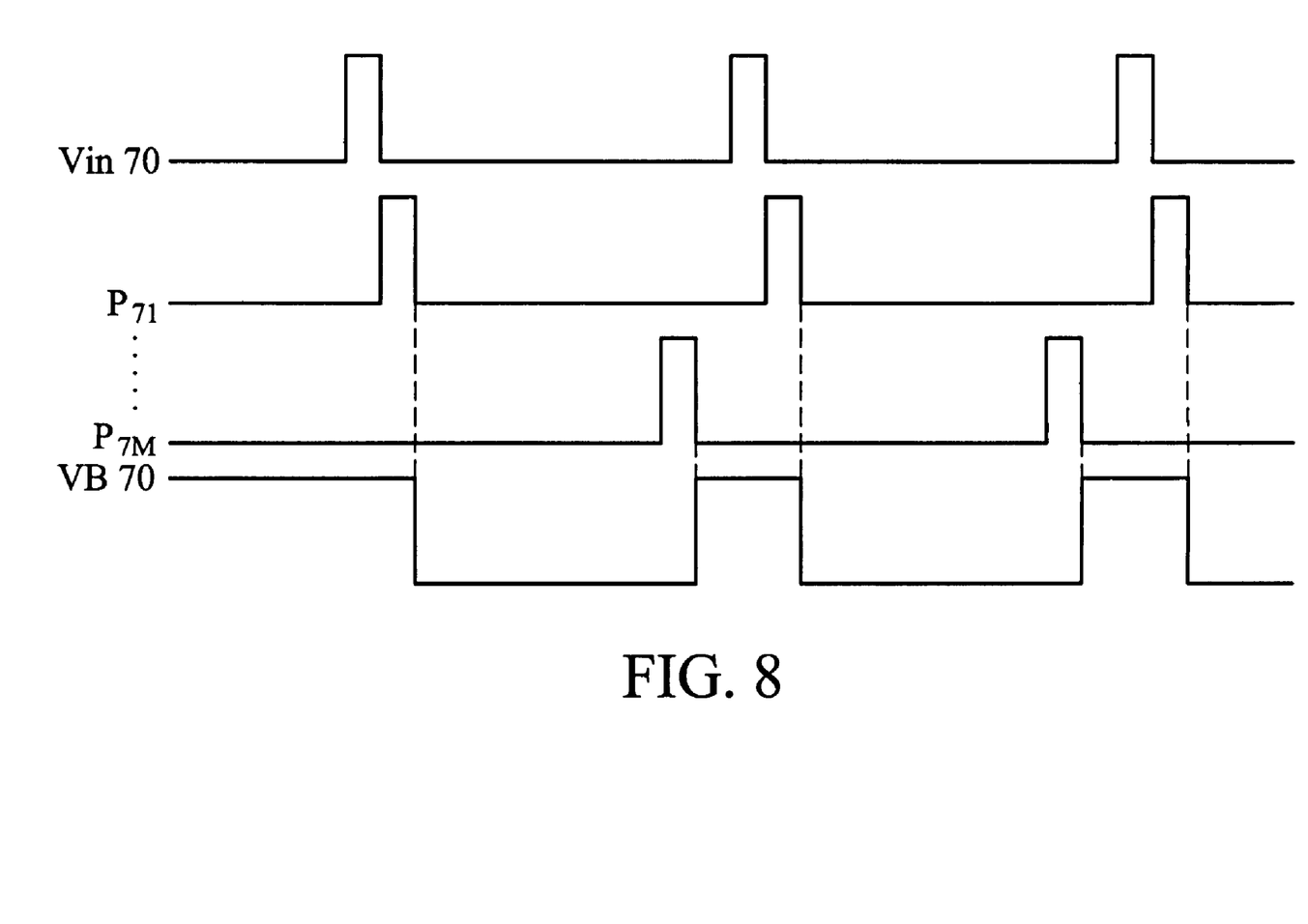
FIG. 8 is a timing chart of the voltage level shifter of FIG. 7.

Referring to the FIG. 8, the voltage level of the input signal Vin70 is high, driving the pulse generating unit 73 to generate M pulses $P_71$ to $P_7M$. Then, after driving the pulse generating unit 73, the voltage level of the input signal Vin70 is immediately changed to low. For the enabling signal VB70, when a voltage level of the pulse $P_71$ is changed from high to low, the level of the enabling signal VB70 is changed to low. The voltage level of the enabling signal VB70 remains low, and is changed to high when a voltage level of the pulse $P_7M$ is changed from low to high.

As described above, when the voltage level of the input signal Vin70 is low, the enabling signal generator 72 outputs the enabling signal VB70, at the low voltage level according to the pulse $P_71$. After the control unit 71 receives the enabling signal VB70, the operation of the control unit 71 is the same as the described above. Thus, when the input signal remains on the low voltage level, the direct current path in the conventional technology is cut off to decrease power consumption.

In addition, when the voltage level of the input signal Vin70 is low, the enable signal generating unit 72 outputs the enabling signal VB70, at the low voltage level according to the pulse P$_7$M. When receiving the enabling signal VB70, the control unit 71 operates normally.

In the embodiment of the present invention, while the voltage level of the voltage of the enabling signal is changed according to the falling edges of the pulses P$_7$1 and P$_7$M, the application is not limited thereto. The voltage of the enabling signal can be changed according to the rising edges of the pulses P$_7$1 and P$_7$M. The number of pulses generated by the pulse generator 73 is determined according to requirements of the system.

Moreover, in some applications, the enable signal VB70 can be provided from external circuits instead of the enabling signal generator 72. In others, the enabling signal generator 72 can directly generates the enable signal VB70 without generating the enable signal VB70 according to the pulses P$_7$1 and P$_7$M.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage level shifter, comprising:
   a shifter unit outputting a third signal according to a first signal and a second signal, wherein a current path is formed in the shifter unit when the first signal remains at a first level;
   a controller coupled to the shifter unit and stopping the current path formed in the shifter unit when the first signal is at the first level;
   a pulse generating unit generating a plurality of pulses according the third signal, wherein the pluses generated comprises a first pulse generated in the beginning and a last pulse generated in the end; and
   an enable signal generating unit coupled to the first and last pulses, wherein when a level of the first pulse is changed from a second level to a third level, the enable signal generating unit provides an enable signal at a fourth level to the controller so that the controller stops the current path according the enable signal.

2. The voltage level shifter as claimed in claim 1, wherein the controller stops the current path according to an enable signal when the first signal remains at the first level.

3. The voltage level shifter as claimed in claim 1, wherein the shifter unit comprises a plurality of transistors and the first and second signals are provided to drain or source terminals of the two transistors.

4. The voltage level shifter as claimed in claim 1, further comprising an enable signal generating unit providing an enable signal to the controller for stopping the current path when the first signal remains at the first level.

5. The voltage level shifter as claimed in claim 1, wherein when the level the last pulse is charged from second level to the third level, the enable signal generating unit provides the enable signal at a fifth level to the controller.

6. The voltage level shifter as claimed in claim 1, wherein the pulse generating unit generates the pulses when the first signal remains at a sixth level and the time when the first signal remains at the first level is longer than the time when the first signal remains at the sixth level.

7. The voltage level shifter as claimed in claim 1, wherein the first and second signals are directly input to the voltage level shifter.

8. The voltage level shifter as claimed in claim 1, wherein the first and second signals are input to the shifter unit through the controller.

9. A voltage level shifter, comprising:
   a shifting unit having:
      a first PMOS transistor;
      a first NMOS transistor coupled to the first PMOS transistor between a first voltage source and a first node;
      a second PMOS transistor; and
      a second NMOS transistor coupled to the second PMOS transistor between the first voltage and a second node, wherein the first node and the second node are respectively coupled to a gate of the second PMOS transistor and a gate of the first PMOS transistor, and a gate of the NMOS transistor and a gate of the NMOS second transistor are coupled the first voltage source; and
   a control unit having:
      a first switch having a first control terminal, a first input terminal coupled to a noninverting input terminal, and a first output terminal coupled to the first node;
      a second switch having a second control terminal, a second input terminal coupled to an inverting input terminal, and a second output terminal coupled to the second node,
   a third switch having a third control terminal, a third input terminal coupled to the first voltage source, and a third output coupled the first node; and
      a fourth switch having a third control terminal, a fourth input terminal coupled to the first voltage source, and a fourth output coupled the second node;
   wherein the first control terminal, the second control terminal, the third control terminal, and the fourth control terminal all receive an enable signal;
   wherein when the enable signal is at a first level, the first switch and the second switch are turned on, and the third switch and the fourth switch are turned off, and then a first signal and a second signal, complementary to each other and input from the noninverting input terminal and the inverting terminal, are correspondingly transmitted to the first node and the second node to be transferred in voltage by the shifting unit; and
   wherein when the enable signal is on a second level, the first switch and the second switch are turned off, and the third switch and the fourth switch are turned on, and then a voltage of the first voltage source is transmitted to the first node and the second node, such that after a level of the first signal is changed from a third level to a fourth level, there is no direct current path between the first voltage source and the noninverting input terminal or between the first voltage source and the inverting input terminal.

10. The voltage level shifter as claimed in claim 9, wherein the first switch and the second switch are NMOS transistors, and the third switch and the fourth switch are PMOS transistors.

11. A sequential pulse generator for a liquid crystal display, comprising:
   a voltage level shifter having a noninverting input terminal receiving a first signal, and a inverting input terminal receiving a second signal, shifting the first signal to output a start pulse signal;

a pulse generating unit, coupled to the voltage level shifter, generating first to N-th continuous pulse signals according to the start pulse signal; and an enable signal generating unit receiving the first continuous pulse signal and the N-th continuous pulse signal and outputting an enable signal, wherein when a level of the first continuous pulse signal is changed from a first level to a second level, the enable signal generating unit changes a level of the enable signal from a third level to a fourth level, and when a level of the N-th continuous pulse signal is changed from the first level to the second level, the enable signal generating unit changes the level of the enable signal from the fourth level to the third level;

a shifting unit comprising:
   a first PMOS transistor;
   a first NMOS transistor coupled to the first PMOS transistor between a first voltage source and a first node;
   a second PMOS transistor; and
   a second NMOS transistor coupled to the second PMOS transistor between the first voltage and a second node, wherein the first node and the second node are respectively coupled to a gate of the second PMOS transistor and a gate of the first PMOS transistor, and a gate of the NMOS transistor and a gate of the NMOS second transistor are coupled to the first voltage source; and a control unit having:
   a first switch having a first control terminal, a first input terminal coupled to a noninverting input terminal, and a first output terminal coupled to the first node;
   a second switch having a second control terminal, a second input terminal coupled to an inverting input terminal, and a second output terminal coupled to the second node;
   a third switch having a third control terminal, a third input terminal coupled to the first voltage source, and a third output coupled the first node; and
   a fourth switch having a third control terminal, a fourth input terminal coupled to the first voltage source, and a fourth output coupled the second node;

wherein the first control terminal, the second control terminal, the third control terminal, and the fourth control terminal all receive an enable signal;

wherein when the enable signal is at the third level, the first switch and the second switch are turned on, and the third switch and the fourth switch are turned off, and then a first signal and a second signal, complementary to each other and input from the noninverting input terminal and the inverting terminal, are correspondingly transmitted to the first node and the second node to be transferred in voltage by the shifting unit; and wherein when the enable signal is at the fourth level, the first switch and the second switch are turned off, and the third switch and the fourth switch are turned on, and then a voltage of the first voltage source is transmitted to the first node and the second node, such that after a level of the first continuous pulse signal is changed from the first level to the second level, there is no direct current path between the first voltage source and the noninverting input terminal or between the first voltage source and the inverting input terminal.

12. The sequential pulse generator as claimed in claim 11, wherein the first switch and the second switch are NMOS transistors, and the third switch and the fourth switch are PMOS transistors.

13. The sequential pulse generator as claimed in claim 11, further comprising an inverter coupled to a connection point between the second PMOS transistor and the second NMOS transistor, for outputting the start pulse signal.

* * * * *